(12) United States Patent
Renz et al.

(10) Patent No.: US 6,806,710 B1
(45) Date of Patent: Oct. 19, 2004

(54) MAGNETIC RESONANCE ANTENNA

(75) Inventors: Wolfgang Renz, Erlangen (DE); Markus Vester, Nuremberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/540,113

(22) Filed: Mar. 31, 2000

(30) Foreign Application Priority Data

Apr. 1, 1999 (DE) .......................................... 199 14 989

(51) Int. Cl.[7] .............................. G01V 3/00; H01P 7/00
(52) U.S. Cl. .................... 324/318; 324/322; 333/219.2
(58) Field of Search .............................. 324/322, 318, 324/319, 320, 303, 307, 309, 312, 314; 335/296; 333/219.2

(56) References Cited

U.S. PATENT DOCUMENTS

| 2,281,405 | A | * | 4/1942 | Barrish et al. ................ 455/63 |
|---|---|---|---|---|
| 2,735,074 | A | * | 2/1956 | McArthur .................... 333/214 |
| 4,620,155 | A | * | 10/1986 | Edelstein .................... 324/322 |
| 5,143,688 | A | * | 9/1992 | Mansfield ................... 324/318 |
| 5,153,517 | A |   | 10/1992 | Oppelt et al. ............... 324/322 |
| 5,168,230 | A | * | 12/1992 | Hashoian .................... 324/318 |
| 5,372,137 | A | * | 12/1994 | Wong et al. ................. 600/422 |
| 5,474,069 | A | * | 12/1995 | Wong et al. ................. 600/422 |
| 5,602,479 | A | * | 2/1997 | Srinivasan et al. ......... 324/318 |
| 5,659,281 | A | * | 8/1997 | Pissanetzky et al. ........ 335/296 |
| 6,177,797 | B1 | * | 1/2001 | Srinivasan .................. 324/318 |
| 6,215,304 | B1 | * | 4/2001 | Slade ........................ 324/303 |
| 6,232,779 | B1 | * | 5/2001 | Tropp et al. ................ 324/322 |
| 6,268,726 | B1 | * | 7/2001 | Prammer et al. ........... 324/303 |
| 6,535,084 | B1 | * | 3/2003 | Tropp ........................ 333/219 |

* cited by examiner

*Primary Examiner*—Diego Gutierrez
*Assistant Examiner*—Tiffany A. Fetzner
(74) *Attorney, Agent, or Firm*—Schiff Hardin LLP

(57) ABSTRACT

A magnetic resonance antenna has at least five antenna elements, each of, which extends essentially radially from an inner element beginning to at least one outer element end with respect to a center axis. The antenna elements are at least magnetically coupled with one another.

14 Claims, 3 Drawing Sheets

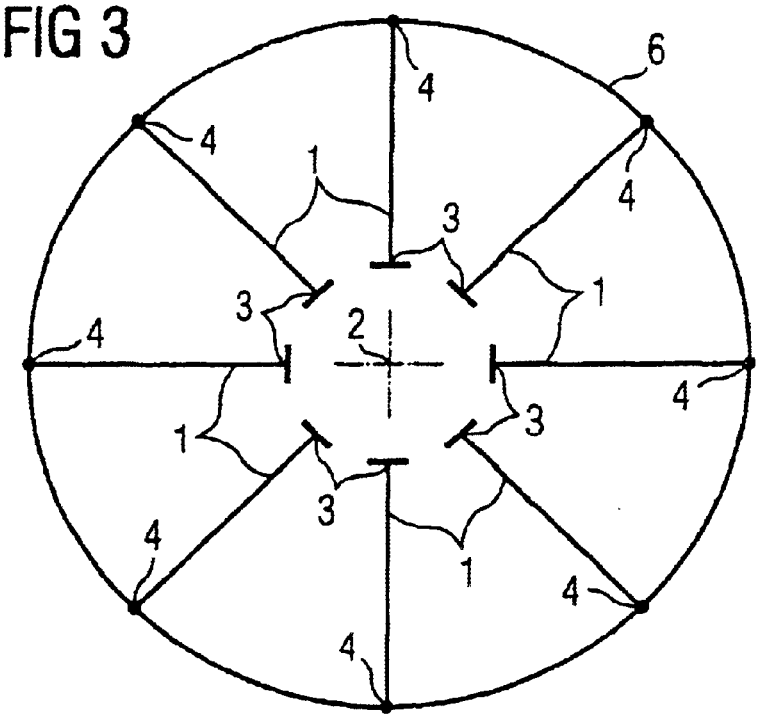
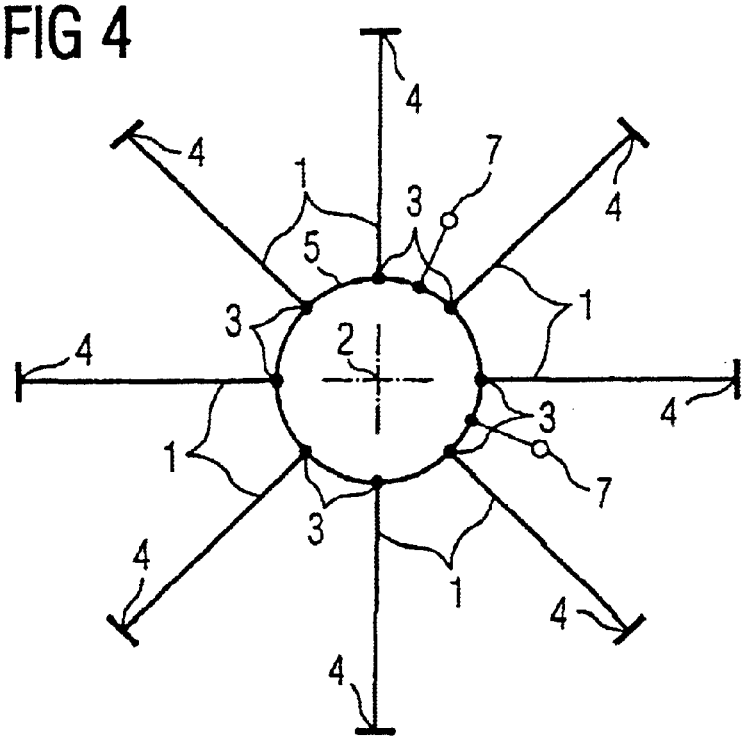

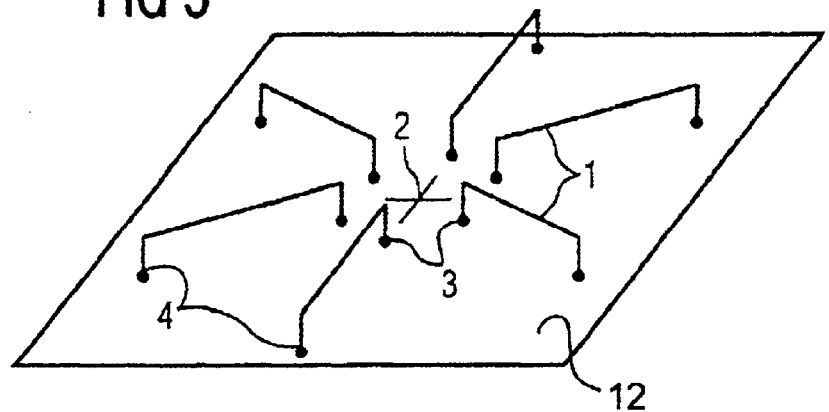
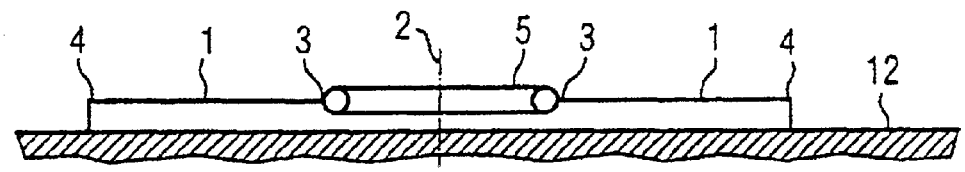
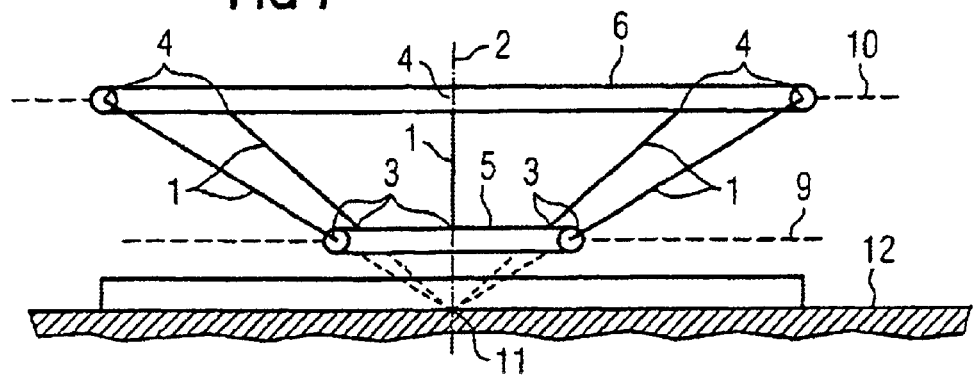

MAGNETIC RESONANCE ANTENNA

BACKGROUND OF THE INVENTION

1. Field of the Invention

The present invention relates to a magnetic resonance antenna for nuclear magnetic resonance systems with a vertical basic field, the magnetic resonance antenna being of the type having a number of antenna elements that extend substantially radially from an inner element to at least one outer element, relative to a center axis, the antenna elements being at least magnetically coupled with one another.

2. Description of the Prior Art

A magnetic resonance antenna of the above type is known from U.S. Pat. No. 5,153,517. This magnetic resonance antenna has four antenna elements that are driven in pairs with 90° phase quadrature.

So-called birdcage resonators are known for magnetic resonance systems with an axial basic field. These have a number of antenna elements that are circularly arranged around a center axis and that extend parallel to the center axis. These antenna elements, at their ends, are connected to one another via ring-shaped connecting elements in an electrically conducting manner.

SUMMARY OF THE INVENTION

An object of the present invention is to provide a magnetic resonance antenna for magnetic resonance systems with a vertical basic field, with which a homogeneous circularly polarized magnetic field can be generated in a simple manner.

The above object is achieved in accordance with the principals of the present invention in a magnetic resonance antenna formed by a number of antenna elements which proceed substantially radially from an inner element beginning to at least one outer element and, relative to a center axis, the antenna elements being at least magnetically coupled with one another, and wherein the number of antenna elements is at least five.

The antenna elements are coupled with one another at least via their magnetic field. In addition, they can also be coupled with one another via connecting elements at the element beginnings and/or element ends. Such an electrically conducting connection is preferably effected via a connecting element that is fashioned in a ring-shaped manner. Alternatively, the element beginnings and/or element ends can be individually connected to a grounding plane instead of being connected among each other with connecting elements.

Capacitors can be arranged in all antenna elements and/or connecting elements in order to adapt the magnetic resonance antenna to the desired operating frequency.

Regardless of the type of coupling, what is important in both cases is that the antenna elements are coupled with one another such that the magnetic field, which is generated by them, is circularly polarized.

In the most simple case, the antenna elements can each have one element beginning and one element end. As warranted, however the antenna elements can be split toward the outside, i.e. they can have at least two element ends.

The geometry of the magnetic resonance antenna can be even. The construction of the magnetic resonance antenna is particularly simple in this case. When the element beginnings define an element beginning plane and the element ends a element end plane, and when the element beginning plane and the element end plane extend parallel to one another and are offset to one another, a particularly homogenous magnetic field results in the area of the center axis. Preferably, the antenna elements are fashioned linear in this case.

The antenna elements each exhibit a line direction, whose extrapolation cuts the center axis in a common intersecting point. The magnetic field generated by means of the magnetic resonance antenna is more homogenous when the element beginning plane and the element end plane extend parallel to a grounding plate. It is particularly homogenous when the intersecting point is situated in the grounding plate.

When the number of antenna elements can be divided by four, the coupling-in and coupling-out of two currents that are phase-shifted by 90° is particularly simple.

DESCRIPTION OF THE DRAWINGS

FIG. 3 is a plane view of a third embodiment of a magnetic resonance antenna constructed in accordance with the principals of the present invention.

FIG. 4 is a plane view of a fourth embodiment of a magnetic resonance antenna constructed in accordance with the principals of the present invention.

FIG. 5 is a perspective view of a magnetic resonance antenna constructed in accordance with principals of the present invention.

FIG. 6 is a side view of the fourth embodiment of the magnetic resonance antenna, shown in FIG. 4.

FIG. 7 is a side view of the first embodiment of the magnetic resonance antenna, shown in FIG. 1.

DESCRIPTION OF THE PREFERRED EMBODIMENTS

Figure 1:
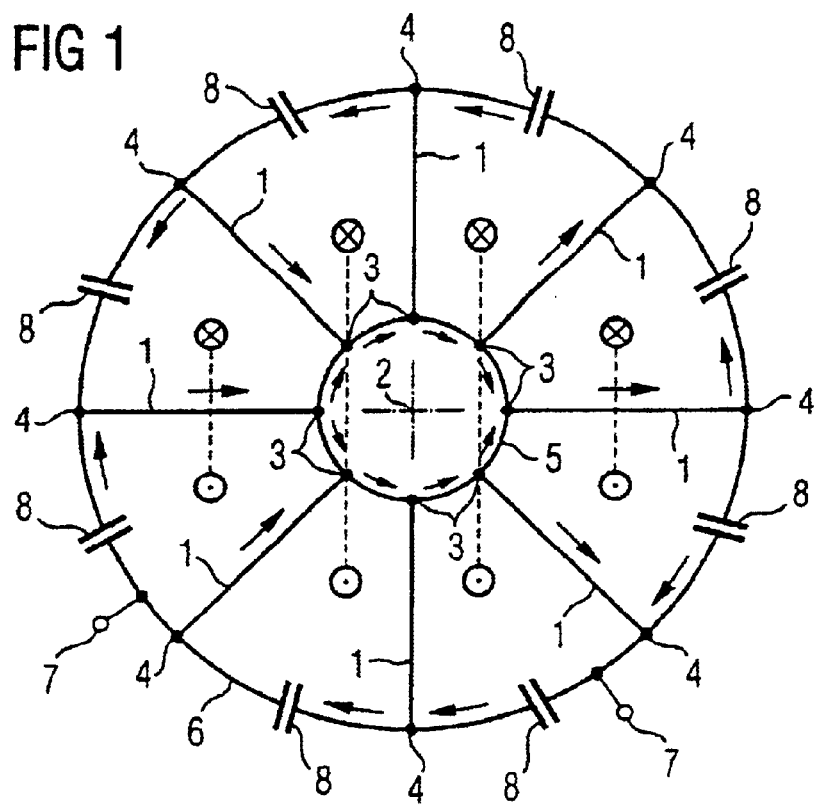
FIG. 1 is a plane view of a first embodiment of a magnetic resonance antenna constructed in accordance with the principals of the present invention.

FIG. 1 shows the basic shape of an inventive magnetic resonance antenna. It has at least five (eight according to FIG. 1) antenna elements 1. The antenna elements 1 extend radially from an inner element bar beginning 3 to an outer element end with respect to a center axis 2. According to FIG. 1, the element beginnings 3 are connected to one another in an electrically conducting manner via an inner connecting element 5, and the element ends 4 are connected to one another in an electrically conducting manner via an outer connecting element 6. According to FIG. 1, both connecting elements 5, 6 are fashioned in a ring-shaped manner. Therefore, the antenna elements 1 not only are magnetically coupled with one another but also are electrically coupled. The magnetic resonance antenna exhibits a cyclic symmetry from antenna element 1 to antenna element 1.

The magnetic resonance antenna has two connections 7, which, offset by 90°, are arranged at the outer connecting element 6. At these two connections 7, two currents that are phase-shifted by 90° can be alternatively coupled in or coupled out with a magnetic resonance frequency f. As a result, a circularly polarized magnetic field can be alternatively emitted or received with the magnetic resonance antenna according to FIG. 1. The magnetic resonance frequency usually lies between 8 MHZ and 100 MHZ. The currents and magnetic fields that flow at a specific point in time are indicated in FIG. 1 by means of the normal symbols.

According to FIG. 1, capacitors 8 are arranged in the outer connecting element 6. Alternatively, the capacitors 8 could be arranged in the inner connecting element 5 or in the antenna elements 1.

FIGS. 2 through 5 show modifications of the basic fashioning according to FIG. 1. Identical elements are thereby provided with identical reference numbers. The capacitors 8 contained in the antenna elements 1 and/or in the connecting elements 5, 6 are not shown in the FIGS. 2 through 5 for simplification.

Figure 2:
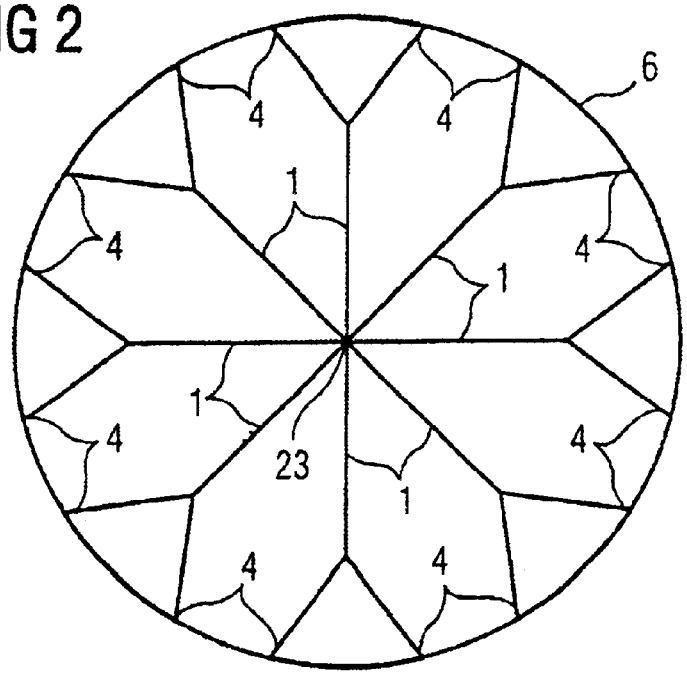
FIG. 2 is a plane view of a second embodiment of a magnetic resonance antenna constructed in accordance with the principals of the present invention.

According to FIGS. 2 and 3, the element ends 4 are connected to one another in an electrically conducting manner via the outer connecting element 6. In contrast thereto, the element beginnings 3 are directly connected to one another in an electrically conducting manner according to FIG. 2 and, according to FIG. 3, are grounded. Further, in the embodiment of FIG. 2, the antenna elements 1 are split toward the outside, i.e. they respectively have two element ends 4. In the embodiment of FIG. 4, the element beginnings 3 are connected to one another in an electrically conducting manner via the inner connecting element 5 and the element ends 4 are grounded.

In the embodiment according to FIG. 5, the antenna elements 1 are only magnetically coupled with one another. According to FIG. 5, the element beginnings 3 and the element ends 4 are grounded at a ground plate 12.

FIG. 6 shows the embodiment of the magnetic resonance antenna according to FIG. 4 in profile from the side. The magnetic resonance antenna is planarly constructed. It is also possible (as explained in the following in connection with FIG. 7) that the element beginnings 3 define an element beginning plane 9 and that the element ends 4 define an element end plane 10, the element beginning plane 9 and the element end plane 10 extending parallel to another, and being offset from one another. FIG. 7 shows the basic fashioning of the magnetic resonance antenna according to FIG. 1 from the side. According to FIG. 7, the antenna element 1 exhibit a line direction. The extrapolation of the line direction intersects the center axis 2 in a common intersecting point 11. The intersecting point 11 is situated in a grounding plate 12, which extends parallel to the element beginning plane 9 and to the element end plane 10. The slope of the antenna elements 1 relative to the grounding plate 12 should not exceed 45°. Otherwise, the slope can be selected as required.

The inventive magnetic resonance antenna exhibits high efficiency given the generation and the reception of a circularly polarized magnetic field.

The number of antenna elements 1 can be selected as required as long as it is equal to or exceeds five. It is particularly beneficial, however, when the number can be divided by four, namely 8, 12, 16 etc. Then, the coupling-in and coupling-out of two currents, which are phase-shifted by 90°, is especially simple for generating or scanning a circularly polarized magnetic field.

The inventive magnetic resonance antenna can be utilized in magnetic resonance systems with a vertical basic field in order to generate or receive a high-frequency magnetic field that is transverse relative to the vertical basic field. Thereby, it is particularly advantageous that crossing (overlapping) antenna element do not occur in the basic design and thus will not come into contact with one another, so that special measures do not have to be undertaken to isolate the elements from one another.

Although modifications and changes may be suggested by those skilled in the art, it is the intention of the inventors to embody within the patent warranted hereon all changes and modifications as reasonably and properly come within the scope of their contribution to the art.

We claim as our invention:

1. A nuclear magnetic resonance antenna comprising:

a plurality of at least five antenna elements disposed in a plane for emitting or receiving magnetic field energy at a magnetic resonance frequency, each antenna element having an element beginning in said plane and an element end in said plane;

said antenna elements being disposed relative to a center axis so as to radiate from the respective element beginnings to the respective element ends outwardly in a spoke-like fashion to allow a radially directed current flow in each antenna element between the element end thereof and the element beginning thereof, and exhibiting cyclical symmetry from antenna element to antenna element;

said antenna elements being at least magnetically coupled with each other in said antenna.

2. A nuclear magnetic resonance antenna as claimed in claim 1, wherein the respective element beginnings and the respective element ends are connected to ground.

3. A nuclear magnetic resonance antenna as claimed in claim 1 wherein said antenna elements are electrically coupled to each other.

4. A nuclear magnetic resonance antenna as claimed in claim 3 wherein the respective element beginnings are electrically connected to each other via a ring-shaped connecting element.

5. A nuclear magnetic resonance antenna as claimed in claim 3 wherein the respective element ends are electrically connected to each other via a ring-shaped connecting element.

6. A nuclear magnetic resonance antenna as claimed in claim 3 wherein the respective element beginnings are electrically connected to each other via a first ring-shaped connecting element and wherein the respective element ends are electrically connected to each other via a second ring-shaped connecting element.

7. A nuclear magnetic resonance antenna as claimed in claim 1, wherein each of said antenna elements has two branching element ends.

8. A nuclear magnetic resonance antenna as claimed in claim 1 wherein the respective antenna elements are linear.

9. A nuclear magnetic resonance antenna as claimed in claim 1 wherein said plurality is divisible by four.

10. A nuclear magnetic resonance antenna comprising:

a plurality of at least five antenna elements for emitting or receiving magnetic field energy at a magnetic resonance frequency, each antenna element having an element beginning and an element end, the respective element beginnings defining an element beginning plane and the respective elements ends defining an element end plane, said element beginning plane and said element end plane being parallel to and spaced from each other;

said antenna elements being disposed relative to a center axis so as to radiate from the respective element beginnings to the respective element ends to allow a radially directed current to flow in each antenna element between the element end thereof and the element beginning thereof, and exhibiting cyclical symmetry from antenna element to antenna element;

the respective antenna elements being linear and three-dimensionally straight to define respective line directions, said line directions intersecting said center axis at a common point outside of said element beginning plane and outside of said element end plane; and said antenna elements being at least magnetically coupled with each other in said antenna.

11. A nuclear magnetic resonance antenna as claimed in claim 10 further comprising a grounding plate disposed parallel to said element beginning plane and said element end plane, and said common point being disposed in said grounding plate.

12. A nuclear magnetic resonance antenna as claimed in claim 10 further comprising a grounding plate disposed parallel to said element beginning plane and said element end plane.

13. A nuclear magnetic resonance antenna as claimed in claim 10 wherein the respective element beginnings are electrically connected to each other via a first ring-shaped connecting element and wherein the respective element ends are electrically connected to each other via a second ring-shaped connecting element.

14. A nuclear magnetic resonance antenna as claimed in claim 10 wherein said plurality is divisible by four.

* * * * *